(12) United States Patent
Cheng et al.

(10) Patent No.: US 10,658,601 B2
(45) Date of Patent: May 19, 2020

(54) ORGANIC LIGHT-EMITTING DISPLAY PANEL AND DISPLAY DEVICE

(71) Applicant: Shanghai Tianma AM-OLED Co., Ltd., Shanghai (CN)

(72) Inventors: Shuang Cheng, Shanghai (CN); Jinghua Niu, Shanghai (CN); Xiangcheng Wang, Shanghai (CN); Qing Zhu, Shanghai (CN); Weili Qiao, Shanghai (CN); Yinhe Liu, Shanghai (CN); Xiaoqian Sun, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/220,077

(22) Filed: Dec. 14, 2018

(65) Prior Publication Data
US 2019/0386234 A1    Dec. 19, 2019

(30) Foreign Application Priority Data

Jun. 13, 2018   (CN) .......................... 2018 1 0619568

(51) Int. Cl.
*H01L 51/50*   (2006.01)
*H01L 27/32*   (2006.01)
*H01L 27/12*   (2006.01)

(52) U.S. Cl.
CPC ...... *H01L 51/5004* (2013.01); *H01L 27/3244* (2013.01); *H01L 51/5016* (2013.01); *H01L 51/5036* (2013.01); *H01L 51/5056* (2013.01); *H01L 51/5076* (2013.01); *H01L 51/5088* (2013.01); *H01L 51/5096* (2013.01); *H01L 27/1214* (2013.01); *H01L 2251/301* (2013.01)

(58) Field of Classification Search
None
See application file for complete search history.

(56) References Cited

FOREIGN PATENT DOCUMENTS

| CN | 103594659 A | 2/2014 |
|----|-------------|--------|
| CN | 106601921 A | 4/2017 |

*Primary Examiner* — Grant S Withers
(74) *Attorney, Agent, or Firm* — Tarolli, Sundheim, Covell & Tummino LLP

(57) ABSTRACT

An organic light-emitting display panel, comprising: an array substrate comprising driving units; an organic light-emitting unit including an anode, a cathode, and an organic functional layer there between, the organic functional layer comprises an organic light-emitting layer, a first electron transmission layer between the cathode and the organic light-emitting layer, and a first hole transmission layer between the anode and the organic light-emitting layer; the first electron transmission layer comprises a first electron transmission matrix and a first dopant comprising an alkaline earth metal element or a rare earth metal element; and the organic light-emitting layer comprises a blue light-emitting layer comprising a blue host material, wherein an electron mobility and a hole mobility of the blue host material satisfy the following conditions: the electron mobility of the blue host material>(the hole mobility of the blue host material)$\times 10^2$ under an electric field of 0.2 MV/cm.

20 Claims, 4 Drawing Sheets

ORGANIC LIGHT-EMITTING DISPLAY PANEL AND DISPLAY DEVICE

CROSS-REFERENCE TO RELATED APPLICATIONS

The present disclosure claims priority to Chinese Patent Application No. 201810619568.X, filed on Jun. 13, 2018, the content of which is incorporated herein by reference in its entirety.

TECHNICAL FIELD

The present disclosure relates to the field of display technologies, and in particular, relates to an organic light-emitting display panel and an organic light-emitting display device.

BACKGROUND

With the rapid development of flat panel display technologies, the organic light-emitting display (OLED) has become more and more popular due to its excellent characteristics such as self-luminescence, high brightness, a wide viewing angle, and fast response.

The light-emitting devices used in current OLED display panels basically adopt a stacked structure. For the light-emitting device, a basic structure is formed by an anode, an organic functional layer, and a cathode. The organic functional layer includes a light-emitting layer and other light-emitting auxiliary layers. On the light-emitting layer, electrons and holes are combined to generate excitons which are unstable and thus release energy. The energy is transferred to the molecules of the organic light-emitting substance in the light-emitting layer, causing their transition from a ground state to an excited state. Since the excited state is very unstable, the excited molecules return from the excited state to the ground state, and light is generated due to the radiation transition. Main functions of other light-emitting auxiliary layers include injecting and transmitting electrons and holes, thereby improving the luminous efficiency of the light-emitting layer. Based on properties and service life of current light-emitting materials, the luminous efficiency and service life of OLED light-emitting devices have become a very important practical topic in the field of OLED display.

SUMMARY

In view of the above, the present disclosure provides an organic light-emitting display panel and an organic light-emitting display device, which can solve the problem in the related art that the electrons and holes in the light-emitting layer of the OLED light-emitting device is not in balance, to be specific, is the difference in mobility of the electrons and holes in the host material of the organic functional layer, resulting in that the electrons and holes cannot be sufficiently combined in the light-emitting layer. In the present disclosure, through optimizing the stacking structure of the OLED device as well as selection and combination of the materials of the organic functional layers, and meanwhile through adding alkaline earth metal in the electron transmission layer, the electron mobility is improved. As a result, the electron mobility and hole mobility in the light-emitting layer is balanced, and the electrons and holes are sufficiently combined in the light-emitting area, which improves the luminous efficiency and utilization of the light-emitting materials, so as to extend service life of the OLED light-emitting display panel, and the displayed image is desirable.

In a first aspect of the present disclosure, an organic light-emitting display panel is provided. The organic light-emitting display panel includes an array substrate comprising a plurality of driving units; and a plurality of organic light-emitting units arranged to correspond to the plurality of driving units, wherein each of the plurality of organic light-emitting units comprises an anode, a cathode, and an organic functional layer arranged between the anode and the cathode, wherein the organic functional layer comprises an organic light-emitting layer, a first electron transmission layer arranged between the cathode and the organic light-emitting layer, and a first hole transmission layer arranged between the anode and the organic light-emitting layer; wherein the first electron transmission layer comprises a first electron transmission matrix and a first dopant, the first dopant comprising one or more substances selected from a group consisting of an alkaline earth metal element and a rare earth metal element; and wherein the organic light-emitting layer comprises a blue light-emitting layer comprising a blue host material, and an electron mobility and a hole mobility of the blue host material satisfy: the electron mobility of the blue host material>(the hole mobility of the blue host material)×102 under an electric field of 0.2 MV/cm.

In a second aspect of the present disclosure, an organic light-emitting display device is provided. The organic light-emitting display device includes the display panel as described above.

The present disclosure provide an organic light-emitting display panel and an organic light-emitting display device, through selecting an appropriate host material for the blue light-emitting layer and doping an alkaline earth metal with a certain concentration in the electron transmission layer, and meanwhile selecting materials for other auxiliary functional layers, so that the excitons is sufficiently combined in the light-emitting layer to emit fluorescence with desired intensity and efficiency, thereby improving service efficiency of the light-emitting material. In the light-emitting materials, since the light-emitting host material in the blue light-emitting layer has a relative short service life, the improvements thereto is more urgent.

In addition, in the present disclosure, through selecting appropriate host materials for the green and red light-emitting layers and doping an alkaline earth metal with a certain concentration in the electron transmission layer, and meanwhile selecting materials for other auxiliary functional layers, so that the excitons is sufficiently combined in the green and red light-emitting layers to improve service life and luminous efficiency of the phosphorescence host material, thereby improving overall efficiency of the OLED device.

Furthermore, in the present disclosure, the hole blocking layer doped with alkaline earth metal or rare earth metal is incorporated, so as to prevent the cancellation phenomenon caused by the holes generated by the anode entering into the hole transmission layer, which may block the luminous effect when the excitons jump, and thus reducing the service efficiency of the light-emitting material. The doping type of metal elements in the hole blocking layer is the same as that in the electron transmission layer which can, in the one hand, make the evaporation process simpler, reduce the number of types of materials and reduce cost and, in the other hand, make the overall performance of the device structure uniform due to doping of the same material.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings without any creative effort.

DESCRIPTION OF EMBODIMENTS

In order to better understand technical solutions of the present disclosure, the embodiments of the present disclosure are described in details with reference to the drawings.

It should be clear that the described embodiments are merely part of the embodiments of the present disclosure rather than all of the embodiments. All other embodiments obtained by those skilled in the art without paying creative labor shall fall into the protection scope of the present disclosure.

The terms used in the embodiments of the present disclosure are merely for the purpose of describing specific embodiment, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects in the front and at the back of "/" is an "or" relationship.

It should be understood that although the terms 'first', 'second' and 'third' may be used in the present disclosure to describe XXX, these XXX should not be limited to these terms. These terms are used only to distinguish the XXX from each other. For example, without departing from the scope of the embodiments of the present disclosure, a first electron transmission layer may also be referred to as a second electron transmission layer. Similarly, the second electron transmission layer may also be referred to as the first electron transmission layer.

Figure 1:
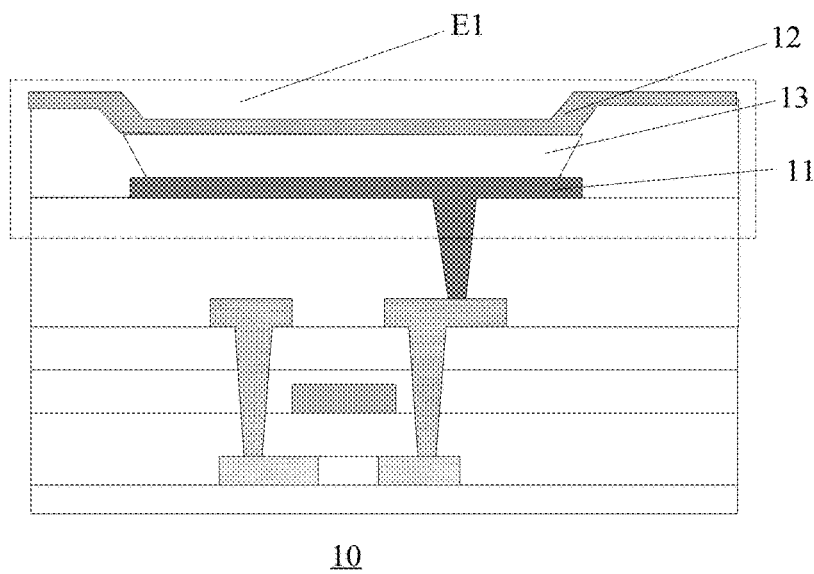
FIG. 1 is a schematic diagram of an organic light-emitting display panel in the prior art.
Figure 2:
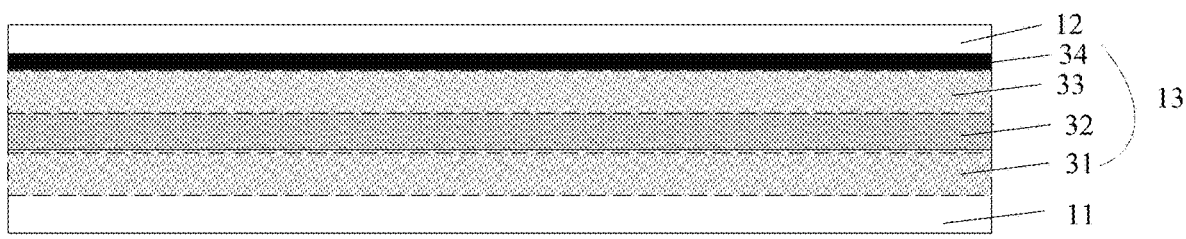
FIG. 2 is a structural schematic diagram of a light-emitting unit E1 of FIG. 1.
Figure 3:
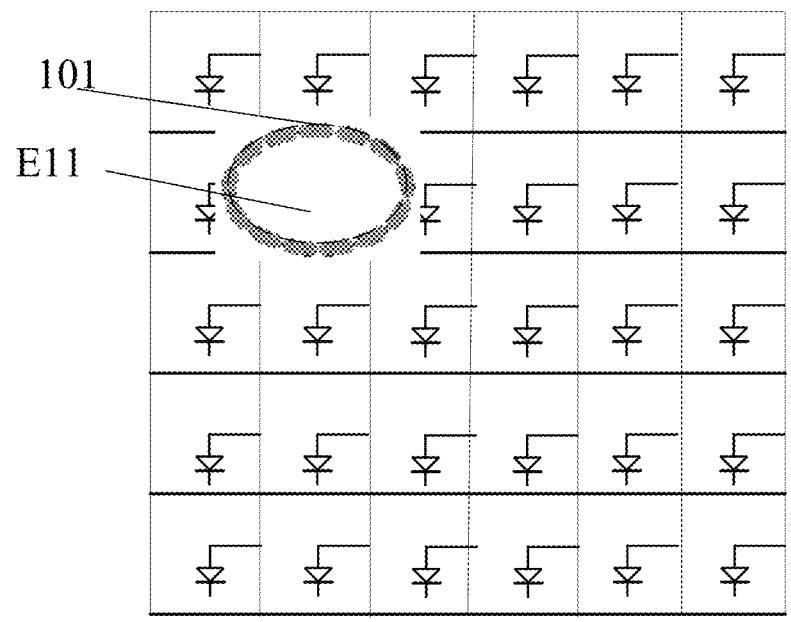
FIG. 3 is a schematic diagram of an organic light-emitting display panel according to an embodiment of the present disclosure.

In order to further illustrate the beneficial effects of the embodiments of the present disclosure, the defects of the related art are exemplified prior to the introduction of the embodiments of the present disclosure. As shown in FIGS. 1 and 2, with a light-emitting unit E11 in an OLED display panel of the related art, the organic functional layer 13 located between the anode 11 and the cathode 12 generally emits light having a corresponding color by a biasing voltage between the anode 11 and the cathode 12 so as to achieve the display effect. However, the luminous efficiency and material service life of the OLED light-emitting unit (also referred to as OLED light-emitting devices or light-emitting devices in the present disclosure) have certain problem at present. In order to improve the luminous efficiency of the OLED light-emitting unit, the overall device structure of the OLED light-emitting unit is required to be modified. As shown in FIG. 3, the stacked structure of the organic functional layer 13 in the light-emitting unit E11 from the anode 11 to the cathode 12 generally includes a hole transmission layer 31, a light-emitting layer 32, an electron transmission layer 33, and a cathode 12. In order to improve the electron transmission efficiency, a layer of Yb (germanium metal) layer 34 can be arranged between the electron transmission layer 33 and the cathode 12. Although the electron transmission efficiency can be improved by arranging an entire Yb layer between the electron transmission layer 33 and the cathode 12, meanwhile, since Yb itself has a high extinction coefficient and a high local content of Yb (due to the setting of entire layer), it is liable to cause absorption of the light emitted by the light-emitting layer 32, resulting in reduction of the light-emitting efficiency of the OLED light-emitting unit E11, so that the efficiency of the OLED display panel is lowered.

Figure 4:
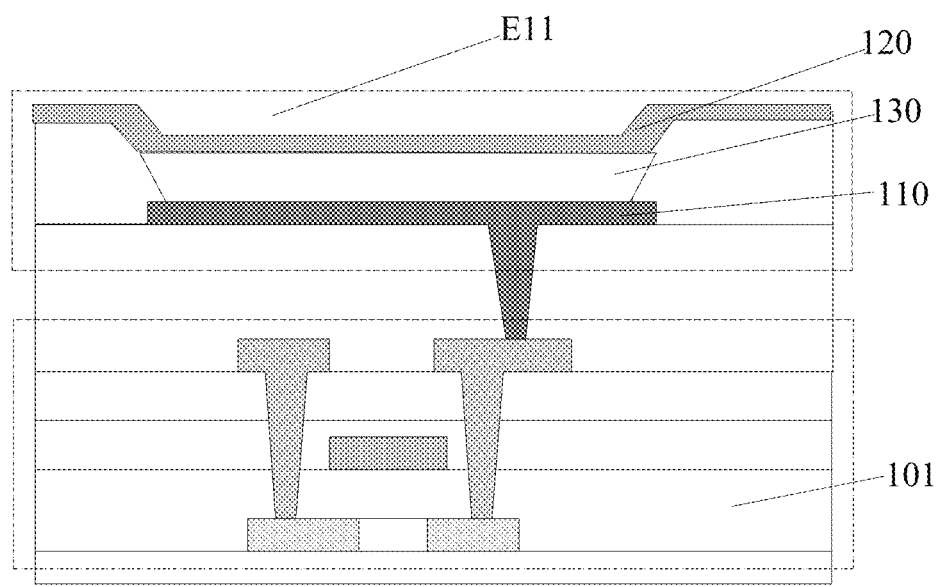
FIG. 4 is a partial cross-sectional diagram of the organic light-emitting display panel of FIG. 3.
Figure 5:
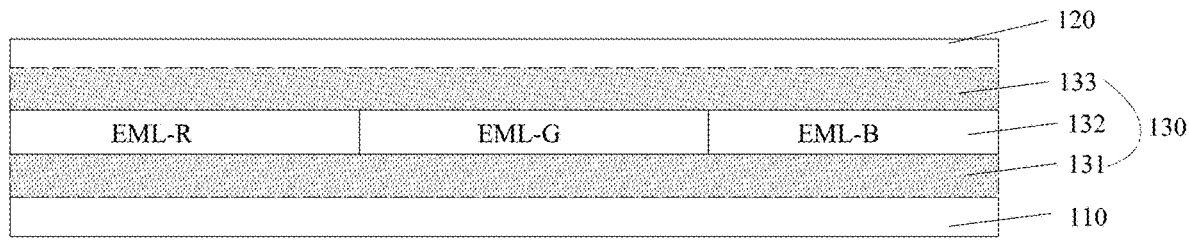
FIG. 5 is a structural schematic diagram of a light-emitting unit E1 of FIG. 3.
Figure 6:
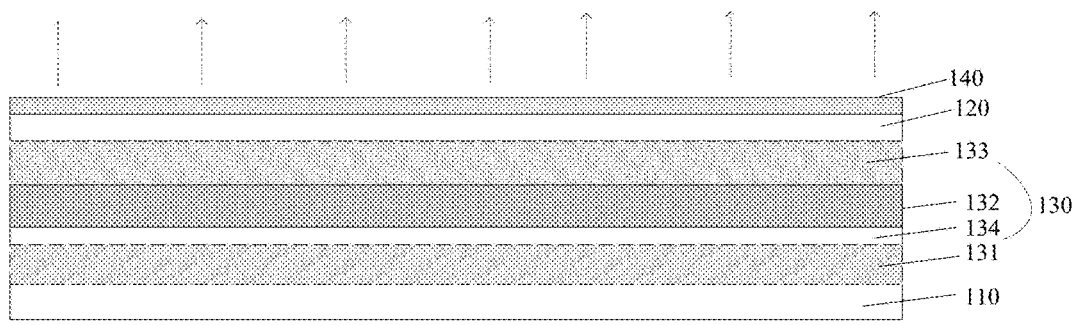
FIG. 6 is another structural schematic diagram of the light-emitting unit E1 of FIG. 3.
Figure 7:
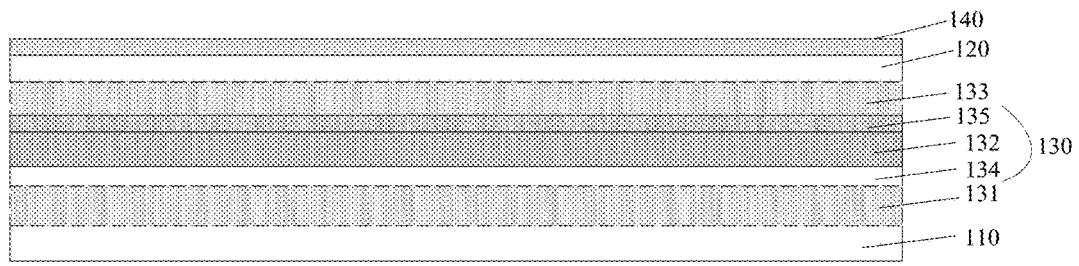
FIG. 7 is another structural schematic diagram of the light-emitting unit E1 of FIG. 3.
Figure 8:
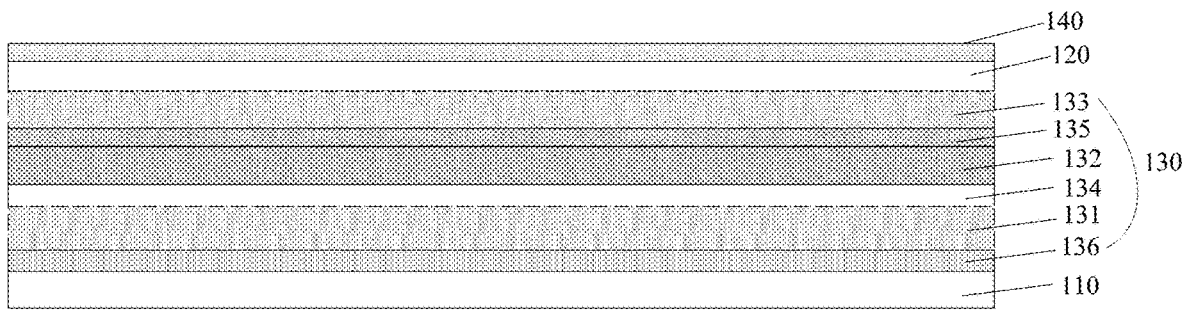
FIG. 8 is another structural schematic diagram of the light-emitting unit E1 of FIG. 3.
Figure 9:
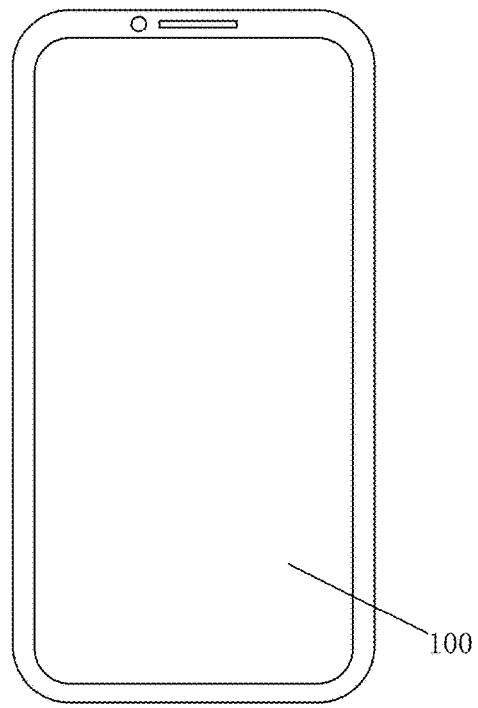
FIG. 9 is a structural schematic diagram of an organic light-emitting display device according to an embodiment of the present disclosure.

As shown in FIGS. 3-9, FIG. 3 is a schematic diagram of an organic light-emitting display panel according to an embodiment of the present disclosure; FIG. 4 is a partial cross-sectional diagram of the organic light-emitting display panel of FIG. 3; FIG. 5 is a structural schematic diagram of a light-emitting unit E1 of FIG. 3; FIG. 6 is another structural schematic diagram of the light-emitting unit E1 of FIG. 3; FIG. 7 is another structural schematic diagram of the light-emitting unit E1 of FIG. 3; FIG. 8 is another structural schematic diagram of the light-emitting unit E1 of FIG. 3; and FIG. 9 is a structural schematic diagram of an organic light-emitting display device according to an embodiment of the present disclosure. As shown in FIGS. 3 and 4, the present disclosure provides an organic light-emitting display panel 100 including an array substrate. The array substrate includes a plurality of driving units 101 (dashed frame) and an organic light-emitting units E11 corresponding to the driving units. FIG. 4 is a cross-sectional diagram showing only a part of the transistor in the driving unit 101. It should be noted that, in the embodiments of the present disclosure, the driving unit 101 is mainly a thin film transistor driving array formed by a low-temperature polysilicon TFT or an oxide semiconductor TFT. The connection relationship between the driving transistor in the driving unit and the corresponding organic light-emitting unit E11 is shown in the drawings. The light-emitting unit E11 includes an anode 110, a cathode 120 and an organic functional layer between the anode 110 and the cathode 120.

As shown in FIG. 5, in the embodiments of the present disclosure, for the light-emitting unit E11, a first hole transmission layer 131, an organic light-emitting layer 132 and a first electron transmission layer 133 are sequentially stacked in a direction from the anode 110 to the cathode 120. The organic light-emitting layer 132 includes a blue light-emitting layer EML-B, a green light-emitting layer EML-G, and a red light-emitting layer EML-R. In the embodiments of the present disclosure, the different color light-emitting layers mainly consist of a composite material system which includes a host material and a doping material.

The excitons are enabled to sufficiently recombine in the light-emitting layer so as to emit fluorescence having desired intensity and efficiency, thereby improving the service efficiency of the blue light-emitting material. In the embodiments of the present disclosure, the blue host material B-host in the blue light-emitting layer is required to have a large difference between the electron transmission rate and the hole transmission rate. Under the electric field of 0.2 MV/cm, the electron mobility of the blue host material B-host>(the hole mobility of the blue host material B-host)×$10^2$.

In an embodiment of the present disclosure, the electron mobility of the blue host material is greater than $5\times10^{-9}$ $cm^2v^{-1}s^{-1}$ under an electric field of 0.2 MV/cm, that is, the migration rate of electrons in the blue host material is greater than $5\times10^{-9}$ $cm^2v^{-1}s^{-1}$; and the hole mobility of the blue host material is greater than $5\times10^{-9}$ $cm^2v^{-1}s^{-1}$ under an electric field of 0.2 MV/cm, that is, the migration rate of holes in the blue host material is greater than $5\times10^{-9}$ $cm^2v^{-1}s^{-1}$. The inventors have discovered through intensive research that the electrons and holes of the blue host material can efficiently recombine to generate the excitons in this case. Meanwhile, in the embodiments of the present disclosure, in order to satisfy the above conditions, optionally, the blue host material includes one or two materials selected from anthracene group and fluorine group. The blue host material may be a small molecule type of blue light-emitting host material containing an anthracene compound. The anthracene compound has higher fluorescence efficiency and is a better material selection for mass production of OLED light-emitting devices. In addition, the blue host material may be a small molecule type of blue light-emitting host material containing a fluorine compound, the small molecule fluorine compound has higher luminous efficiency, its structure has a stable fluorene ring and has a large conjugated system and good rigid coplanarity, as well as a high glass transition temperature and a good thermal temperature. Therefore, they are good materials in the evaporation process of the OLED light-emitting device for mass production.

In order to achieve the differentiation requirements on the electrons and the holes in the blue host material, the light-emitting unit E11 in the embodiments of the present disclosure is further provided with a first electron transmission layer 133 between the cathode 120 and the organic light-emitting layer 132, which mainly serves to efficiently transfer the electrons generated by the cathode 120 under the action of an electric field to the corresponding light-emitting layer so as to achieve exciton recombination, thus generating fluorescence or phosphorescence. In order to further improve the luminous efficiency of the blue light in the blue light-emitting layer, in the embodiments of the present disclosure, the first electron transmission layer 133 is doped with the first dopant so that the problem such as an excessive high interface energy barrier between the electron transmission layer and the cathode can be solved. Therefore, the migration rates of electrons and holes in the OLED light-emitting device are balanced, thereby improving the exciton generation efficiency in the organic light-emitting layer.

In the embodiments of the present disclosure, the first electron transmission layer 133 includes a first electron transmission matrix and a first dopant, wherein the first electron transmission matrix includes at least one of phenanthroline, bipyridine and mixture thereof, and the first dopant is one or more substances selected from a group consisting of an alkaline earth metal element, a rare earth metal element, and mixture thereof.

In the embodiments of the present disclosure, the first dopant includes at least one metal element selected from a group consisting of Mg, Ga, Yb, Sm, Gd, Tm, Lu and Y, and in which Yb (ytterbium metal) is preferred. In order to achieve the dispersibility of the first dopant in the first electron transmission matrix, the problem that the light generated by the light-emitting layer is absorbed by the Yb (ytterbium metal) in the light-out path is prevented, and meanwhile, the electron injection and transmission efficiency of the cathode 120 can be improved. In the embodiments of the present disclosure, the first dopant is added by a ratio R of the volume of the first dopant to the volume of the first electron transmission matrix being less than 7%.

In addition, in order to achieve that the first electron transmission layer 133 has a good optical conductivity to the light-emitting layer and reduce the extinction phenomenon caused by doping, in the embodiments of the present disclosure, the ratio Y of the thickness of the first electron transmission layer 133 and the thickness of the cathode 120 ranges from 0.25 to 4.

In a further preferred embodiment, Yb (ytterbium metal) is added to the first electron transmission matrix in a volume ratio R of about 3%. Meanwhile, in another embodiment of the present disclosure, the doping of Yb (ytterbium metal) in the first electron transmission matrix may exhibit a different concentration gradient distribution, for example, the volume ratio of Yb (ytterbium metal) is gradually increased in a direction from the intermediate position of the first electron transmission layer 133 to the cathode 120, or the volume ratio of Yb (ytterbium metal) is gradually decreased in a direction from the intermediate position of the first electron transmission layer 133 away from the cathode 120, thereby injection and transmission of the electrons are more efficiently realized and the carrier migration balance is promoted in the blue light-emitting layer EML-B, therefore the blue host material B-host in the blue light-emitting layer is required to have a large difference between the electron transmission rate and the hole transmission rate. The electron mobility of the blue host material B-host>(the hole mobility of the blue host material B-host)×$10^2$ is satisfied under an electric field of 0.2 MV/cm.

In order to improve the overall luminous efficiency and service life of the OLED light-emitting unit E11, as shown in FIG. 5, in the embodiments of the present disclosure, the inventors have discovered through intensive research that the selection for the host material of the green light-emitting layer EML-G and the host material of the red light-emitting layer EML-R is also an important factor. In order to enable the excitons to sufficiently recombine in the light-emitting layer so as to emit phosphorescence having desired intensity and efficiency, thereby improving the service efficiency of the green light-emitting material, the green host material G-host in the green light-emitting layer requires to have a large difference between the electron transmission rate and the hole transmission rate.

For the green host material in the green light-emitting layer EML-G, the electron mobility of the green host material and the hole mobility of the green host material satisfy the following conditions:

$|\log_{10}(\text{hole mobility}) - \log_{10}(\text{electron mobility})| < 4.$

In a preferred embodiment, the electron mobility of the green host material G-host is greater than $2\times10^{-8}$ cm$^2$v$^{-1}$s$^{-1}$ under an electric field of 0.2 MV/cm, that is, the migration rate of electrons in the green host material G-host is greater than $2\times10^{-8}$ cm$^2$v$^{-1}$s$^{-1}$. Meanwhile, the hole mobility of the green host material is greater than $2\times10^{-7}$ cm$^2$v$^{-1}$s$^{-1}$ under an electric field of 0.2 MV/cm, that is, the migration rate of holes in the green host material G-host is greater than $2\times10^{-7}$ cm$^2$v$^{-1}$s$^{-1}$. The inventors have discovered through intensive research that in the case of the green host materials such as phosphorescent small molecule materials, electrons and holes can efficiently recombine to generate excitons. Meanwhile, in the embodiments of the present disclosure, in order to satisfy the above conditions, optionally, the green host material includes an organometallic small molecule compound containing a heavy metal group, such as an iridium Ir-containing organometallic compound.

In another embodiment, in order to enable the excitons to be sufficiently recombined in the light-emitting layer so as to emit phosphorescence having a desired intensity and efficiency and further improve the service efficiency of the red light-emitting material, the red host material R-host in the red light-emitting layer is required to have a large difference between the electron transmission rate and the hole transmission rate.

For the red host material in the red light-emitting layer EML-R, the electron mobility of the red host material and the hole mobility of the red host material satisfy the following conditions:

$$|\log_{10}(\text{hole mobility}) - \log_{10}(\text{electron mobility})| < 4.5.$$

In a preferred embodiment, the electron mobility of the red host material R-host is greater than $1\times10^{-8}$ cm$^2$v$^{-1}$s$^{-1}$ under an electric field of 0.2 MV/cm, that is, the migration rate of electrons in the red host material R-host is greater than $1\times10^{-8}$ cm$^2$v$^{-1}$s$^{-1}$. Meanwhile, the hole mobility of the red host material R-host is greater than $1\times10^{-7}$ cm$^2$v$^{-1}$s$^{-1}$ under the electric field of 0.2 MV/cm, that is, the migration rate of holes in the green host material R-host is greater than $1\times10^{-7}$ cm$^2$v$^{-1}$s$^{-1}$. The inventors have discovered through intensive research that in the case of the red host materials such as phosphorescent small molecular materials, electrons and holes can efficiently recombine to generate excitons. Meanwhile, in the embodiments of the present disclosure, in order to satisfy the above conditions, optionally, the red host material includes an organometallic small molecule compound containing a heavy metal group, such as an iridium Ir-containing organometallic compound.

In addition, in another embodiment, when the red light-emitting layer is a double-host material Co-host, that is, when a P-type host material P-host and a N-type host material N-host are included, the following conditions shall be satisfied:

$$|\log_{10}(P\text{-host hole mobility}) - \log_{10}(N\text{-host electron mobility})| < 4.5.$$

According to the above description, with the embodiments of the present disclosure, by selecting and matching the host materials of the different color light-emitting layers, the differential design of the carrier mobility of the light-emitting layer and the design of doping with specific concentration and specific thickness for the electron transmission layer can be realized, so that the requirement of the service life of the light-emitting device can be satisfied in the aspect concerning the overall performance, thereby ensuring the luminous efficiency and the service life of the OLED organic light-emitting display panel.

In order to improve the overall luminous efficiency and the service life of the OLED light-emitting unit E11, a stacking design of another light-emitting unit E11 is disclosed in the embodiments of the present disclosure, in which the dotted arrow in FIG. 6 represents a light-emitting direction. As shown in FIG. 6, an anode 110, an organic functional layer 130, a cathode 120, and a light extraction layer 140 are sequentially stacked in the light-emitting unit E11 along a direction from the anode 110 to the cathode 120. A first hole transmission layer 131, a first electron blocking layer 134, an organic light-emitting layer 132 and a first electron transmission layer 133 are sequentially stacked in the organic functional layer 130 along a direction from the anode 110 to the cathode 120. The organic light-emitting layer 132 includes a blue light-emitting layer EML-B, a green light-emitting layer EML-G, and a red light-emitting layer EML-R (not shown in FIG. 6). In the embodiments of the present disclosure, by arranging the first electron blocking layer 134, electrons are prevented from entering into the first hole transmission layer 131 and/or the anode 110 which result in the quenching phenomenon, thereby reducing the recombination probability of the excitons in the light-emitting layer 132, and reducing the emission of phosphorescence or fluorescence.

In order to form a good matching of the light-emitting devices with each other, the present inventors have found that it is required that the materials of the respective layers in the organic functional layer are suitably selected and the energy levels are matched. HOMO (Highest Occupied Molecular Orbital), LUMO (Lowest Unoccupied Molecular Orbital) and T1 have great influence on the characteristics of the organic functional materials.

HOMO is the highest occupied orbit of electrons, and LUMO is the lowest unoccupied orbit of electrons. Generally, Eg=|HOMO−LUMO|, HOMO embodies an ability of binding electrons, and LUMO embodies an ability of receiving electrons. If the binding ability is small, it has the property of an electron donor; and if the ability of receiving electrons is strong, it has the property of an electron acceptor. In addition, T1 is a triplet level.

In the embodiments of the present disclosure, in order to better match the energy level between the first hole transmission layer 131 and the organic light-emitting layer 132 and prevent the energy barrier from being mismatched to affect the carrier mobility, the triplet level T1.EBL of the material of the electron blocking layer 134 is greater than 2.3 ev, and an absolute value |LUMO.EBL| of the lowest unoccupied molecular orbital energy level LUMO.EBL of the material of the first electron blocking layer 134 is smaller than 2.6 ev.

Meanwhile, since the first electron blocking layer 134 is arranged adjacent to the organic light-emitting layer 132, in order to achieve the desired requirements for the electron mobility or the hole mobility, the lowest unoccupied molecular orbital energy level LUMO.EBL of the material of the first electron blocking layer 134 is required to satisfy the following conditions:

$$|\text{LUMO.EML-host}| < |\text{LUMO.EBL}|,$$

so as to ensure the migration of the carriers.

According to the above description, with the embodiments of the present disclosure, by arranging the electron blocking layer required for the particular energy level, the differential mobility of electrons and holes in the light-emitting layer is achieved by the aid of the stacked structure of the devices, so that the requirement of the service life of the light-emitting device can be satisfied in the aspect concerning the overall performance, thereby ensuring the luminous efficiency and the service life of the OLED organic light-emitting display panel.

In addition, it should be noted that, in the embodiments, the light extraction layer 140 is arranged outside the cathode 120, i.e., the light-out direction, so as to reduce loss of the light emitted by the OLED light-emitting unit, improve the light-emitting rate of the OLED light-emitting device, further improve the luminous efficiency of the OLED light-emitting device, reduce the overall power consumption of the OLED display panel, and prolong the service life of the OLED light-emitting device. In order to achieve a predetermined technical purpose, in the embodiments of the present disclosure, the thickness of the light extraction layer 140 is required to be 45-100 nm, and the refractive index of the light extraction layer 140 is required to be 1.6-2.2. Meanwhile, optionally, in order to achieve better light extraction efficiency, the extraction layer may be a periodic grating microstructure ranging from 500 nm to 520 nm. In the embodiments of the present disclosure, by providing a light extraction layer in the internal structure of the organic light-emitting display panel, the reflection loss and refraction loss in the OLED light-emitting unit are reduced, thus light-emitting efficiency is improved with a lower process cost.

In order to improve the overall luminous efficiency and the service life of the OLED light-emitting unit E11, based on the above embodiments, a stacking design of another light-emitting unit E11 is disclosed in the embodiments of the present disclosure. As shown in FIG. 7, an anode 110, an organic functional layer 130, a cathode 120, and a light extraction layer 140 are sequentially stacked in the light-emitting unit E11 along a direction from the anode 110 to the cathode 120. A first hole transmission layer 131, a first electron blocking layer 134, an organic light-emitting layer 132, a first hole blocking layer 135 and a first electron transmission layer 133 are sequentially stacked in the organic functional layer 130 along a direction from the anode 110 to the cathode 120. The organic light-emitting layer 132 includes a blue light-emitting layer EML-B, a green light-emitting layer EML-G, and a red light-emitting layer EML-R (not shown in FIG. 7). In the embodiments of the present disclosure, by arranging the first hole blocking layer 135, electrons are prevented from entering into the first electron transmission layer 133 and/or the cathode 120 which may result in the quenching phenomenon, thereby reducing the recombination probability of the excitons in the light-emitting layer 132, and reducing the emission of phosphorescence or fluorescence.

In order to form a good matching of the light-emitting devices with each other, the present inventors have found that it is required that the materials of the respective layers in the organic functional layer are suitably selected and the energy levels are matched.

In the embodiments of the present disclosure, in order to better match the energy level between the first electron-transmission layer 133 and the organic light-emitting layer 132, the energy barrier is prevented from being mismatched to affect the carrier mobility, an absolute value |HOMO.HBL| of the highest unoccupied orbital energy level HOMO.HBL of the material of the first hole blocking layer 135 satisfies the following relationship:

$$5.6\ eV < |HOMO.HBL| < 6.5\ eV.$$

An absolute value |LUMO.HBL| of the lowest unoccupied molecular orbital energy level LUMO.HBL of the material of the first hole blocking layer 135 satisfies the following relationship:

$$2.1\ eV < |LUMO.HBL| < 3\ eV.$$

Meanwhile, since the first hole blocking layer 135 is arranged adjacent to the organic light-emitting layer 132, in order to achieve the desired requirements for the electron mobility or the hole mobility, an absolute value of the difference between the lowest unoccupied molecular orbital energy level LUMO.EBL of the material of the first hole blocking layer 135 and the lowest unoccupied molecular orbital energy level LUMO.EML-host of the host material of the organic light-emitting layer is required to satisfy the following conditions:

$$|LUMO.EML\text{-}host - LUMO.HBL| < 1\ eV,$$

so as to ensure the migration of the carriers.

In addition, in order to improve the blocking effect of the first hole blocking layer 135 to the hole transmission, in the embodiments of the present disclosure, an alkaline earth metal element or a rare earth metal element may be added to the hole blocking layer, which can be a same metal type doped in the first electron transmission layer, thereby increasing the electron transmission efficiency and absorbing holes. As an optional doping way, at least one metal element selected from a group consisting of Mg, Ga, Yb, Sm, Gd, Tm, Lu and Y may be added to the first hole blocking layer 135, in which Yb (ytterbium metal) is preferable. The doping ratio may be consistent with the doping ratio in the first electron transmission layer.

According to the above description, with the embodiments of the present disclosure, by arranging the hole blocking layer required for the particular energy level and doping with the corresponding alkaline earth metal, the differential mobility of electrons and holes in the light-emitting layer is achieved by the aid of the stacked structure of the devices, so that the requirement of the service life of the light-emitting device can be satisfied in the aspect concerning the overall performance, thereby ensuring the luminous efficiency and the service life of the OLED organic light-emitting display panel.

In order to improve the overall luminous efficiency and the service life of the OLED light-emitting unit E11, based on the above embodiments, a stacking design of another light-emitting unit E11 is disclosed in the embodiments of the present disclosure. As shown in FIG. 8, an anode 110, an organic functional layer 130, a cathode 120, and a light extraction layer 140 are sequentially stacked in the light-emitting unit E11 along a direction from the anode 110 to the cathode 120. A first hole injection layer 136, a first hole transmission layer 131, a first electron blocking layer 134, an organic light-emitting layer 132, a first hole blocking layer 135 and a first electron transmission layer 133 are sequentially stacked in the organic functional layer 130 along a direction from the anode 110 to the cathode 120. The organic light-emitting layer 132 includes a blue light-emitting layer EML-B, a green light-emitting layer EML-G, and a red light-emitting layer EML-R (not shown in FIG. 8). In the embodiments of the present disclosure, by arranging the first hole injection layer 136, the amount and efficiency of hole injection in the anode 110 is increased. Meanwhile, by the design of matching the first hole transmission layer 131 and the first hole injection layer 136, the luminous efficiency can be improved from the overall stacked structure of the OLED light-emitting unit.

In order to form a good matching of the light-emitting devices with each other, the present inventors have found that it is required that the materials of the respective layers in the organic functional layer are suitably selected and the energy levels are matched.

In the embodiments of the present disclosure, in order to better match the energy level between the first hole injection layer 136 and the first electron blocking layer 134, the energy barrier is prevented from being mismatched to affect the carrier mobility, an absolute value |HOMO.HTL| of the highest occupied orbital energy level HOMO.HTL of the material of the first hole transmission layer 131 satisfies the following relationship:

4.8 eV<|HOMO.HTL|<5.6 eV

An absolute value |LUMO.HTL| of the lowest unoccupied molecular orbital energy level LUMO.HTL of the material of the first hole transmission layer 131 satisfies the following relationship:

1.7 eV<|LUMO.HTL|<3.2 eV.

Meanwhile, since the first hole transmission layer 131 is arranged adjacent to the organic light-emitting layer 132, in order to achieve the desired requirements for the electron mobility or the hole mobility, an absolute value of the difference between the lowest unoccupied molecular orbital energy level LUMO.HTL of the material of the first hole transmission layer 131 and the lowest unoccupied molecular orbital energy level LUMO.EML-host of the host material of the organic light-emitting layer is required to satisfy the following conditions:

|LUMO.EML-host−LUMO.HTL|<1.2 eV, so as to ensure the migration of the carriers.

Meanwhile, since the first hole transmission layer 131 and the first electron blocking layer 134 are arranged, in order to achieve the desired requirements for the electron mobility or the hole mobility, the triplet level T1.HTL of the hole transmission layer and the triplet level T1.EBL of the electron blocking layer satisfy the following conditions:

|T1.HTL−T1.EBL|<0.4 eV.

In the embodiments of the present disclosure, in order to better match the energy level between the anode 110 and the first hole transmission layer 131 and prevent the energy barrier from being mismatched to affect the carrier mobility, by adding a P-type dopant into the first hole injection layer 136, the lowest unoccupied molecular orbital energy level LUMO.P-HIL of the P-type dopant satisfies the following condition:

|LUMO.P-HIL|>4 eV.

Meanwhile, since the first hole injection layer 136 is required to match the energy level with the organic light-emitting layer 132, in order to achieve the desired requirements for the electron mobility or the hole mobility, an absolute value of the difference between the lowest unoccupied molecular orbital energy level LUMO.HTL of the material of the first hole injection layer 136 and the lowest unoccupied molecular orbital energy level LUMO.EML-host of the host material of the organic light-emitting layer 60 is required to satisfy the following conditions:

|LUMO.EML-host−HOMO.P-HIL|<1.2 eV, so as to ensure the migration of the carriers.

In addition, since an electron blocking layer is further arranged in the OLED light-emitting device, in order to better match the energy level of the first electron blocking layer 134, the triplet level T1.HIL of the first hole injection layer 136 and the triplet level T1.EBL of the first electron blocking. Layer 134 satisfy the following condition:

|T1.HIL|>|T1.EBL|.

According to the above description, with the embodiments of the present disclosure, by arranging the hole injection layer and the hole transmission layer required for the particular energy level, the differential mobility of electrons and holes in the light-emitting layer is achieved by the aid of the stacked structure of the devices, so that the requirement of the service life of the light-emitting device can be satisfied in the aspect concerning the overall performance, thereby ensuring the luminous efficiency and the service life of the OLED organic light-emitting display panel.

According to an embodiment of the present disclosure, an organic light-emitting display device is provided. FIG. 9 is a schematic diagram of a display device according to an embodiment of the present disclosure. The display device includes the display panel 100 described above. The structure of the display panel 100 has been described in detail in the above embodiments, which is not described herein again. Of course, the display device shown in FIG. 9 is merely illustrative, and the display device may be any electronic device having a display function such as a mobile phone, a tablet computer, a laptop computer, an electronic paper book, or a television.

With the display device provided by the embodiments according to the present disclosure, by selecting the light-emitting host materials in the respective light-emitting unit of the light-emitting units E11 of the display panel, and simultaneously matching the energy levels between the respective organic functional layers, the excitons in the OLED light-emitting unit are sufficiently recombined to emit fluorescence having a desired intensity and efficiency, thereby improving the service efficiency of the light-emitting material. Since the service life of the luminescent host material in the blue light-emitting layer is relatively short in the light-emitting material, it is more urgent to improve the service life thereof.

The above are merely preferred embodiments of the present disclosure, which, as mentioned above, are not used to limit the present disclosure. Whatever within the principles of the present disclosure, including any modification, equivalent substitution, improvement, etc., shall fall into the protection scope of the present disclosure.

What is claimed is:

1. An organic light-emitting display panel, comprising:
   an array substrate comprising a plurality of driving units; and
   a plurality of organic light-emitting units arranged to correspond to the plurality of driving units, wherein each of the plurality of organic light-emitting units comprises an anode, a cathode, and an organic functional layer arranged between the anode and the cathode,
   wherein the organic functional layer comprises an organic light-emitting layer, a first electron transmission layer arranged between the cathode and the organic light-emitting layer, and a first hole transmission layer arranged between the anode and the organic light-emitting layer;
   wherein the first electron transmission layer comprises a first electron transmission matrix and a first dopant, the first dopant comprising one or more substances selected from a group consisting of an alkaline earth metal element and a rare earth metal element; and wherein the organic light-emitting layer comprises a blue light-emitting layer comprising a blue host material, and an electron mobility and a hole mobility of the blue host material satisfy:

the electron mobility of the blue host material>(the hole mobility of the blue host material)×$10^2$ under an electric field of 0.2 MV/cm.

2. The organic light-emitting display panel according to claim 1, wherein the electron mobility of the blue host material is greater than $5×10^{-9}$ $cm^2v^{-1}s^{-1}$ under the electric field of 0.2 MV/cm; and the hole mobility of the blue host material is greater than $5×10^{-9}$ $cm^2v^{-1}s^{-1}$ under the electric field of 0.2 MV/cm.

3. The organic light-emitting display panel according to claim 1, wherein the blue host material comprises one or two materials selected from an anthracene group or a fluorine group.

4. The organic light-emitting display panel according to claim 1, wherein the organic light-emitting layer further comprises a green light-emitting layer comprising a green host material, and an electron mobility and a hole mobility of the green host material satisfy:

|$log_{10}$(hole mobility)−$log_{10}$(electron mobility)|<4.

5. The organic light-emitting display panel according to claim 4, wherein the electron mobility of the green host material is greater than $2×10^{-8}$ $cm^2v^{-1}s^{-1}$ under the electric field of 0.2 MV/cm; and the hole mobility of the green host material is greater than $2×10^{-7}$ $cm^2v^{-1}s^{-1}$ under the electric field of 0.2 MV/cm.

6. The organic light-emitting display panel according to claim 1, wherein the organic light-emitting layer further comprises a red light-emitting layer comprising a red host material, an electron mobility and a hole mobility of the red host material satisfy:

|$log_{10}$(hole mobility)−$log_{10}$(electron mobility)|<4.5.

7. The organic light-emitting display panel according to claim 6, wherein the electron mobility of the red host material is greater than $1×10^{-8}$ $cm^2v^{-1}s^{-1}$ under the electric field of 0.2 MV/cm; and the hole mobility of the red host material is greater than $1×10^{-7}$ $cm^2v^{-1}s^{-1}$ under the electric field of 0.2 MV/cm.

8. The organic light-emitting display panel according to claim 1, wherein in the first electron transmission layer, a volume ratio R of the first dopant to the first electron transmission matrix is less than or equal to 7%; and a thickness ratio Y of the first electron transmission layer to the cathode is in a range of 0.25-4.

9. The organic light-emitting display panel according to claim 8, wherein the first dopant comprises at least one metal element selected from a group consisting of Mg, Ga, Yb, Sm, Gd, Tm, Lu and Y; and the first electron transmission matrix comprises at least one of phenanthroline and bipyridine.

10. The organic light-emitting display panel according to claim 1, wherein the organic functional layer further comprises an electron blocking layer arranged between the anode and the organic light-emitting layer, and the electron blocking layer has a triplet level T1.EBL greater than 2.3 ev.

11. The organic light-emitting display panel according to claim 10, wherein the electron blocking layer has a lowest unoccupied molecular orbital energy level LUMO.EBL having an absolute value |LUMO.EBL| smaller than 2.6 ev.

12. The organic light-emitting display panel according to claim 10, wherein an absolute value |LUMO.EML-host| of a lowest unoccupied molecular orbital energy level of a host material of the organic light-emitting layer LUMO.EML-host satisfies:

|LUMO.EML-host|<|LUMO.EBL|.

13. The organic light-emitting display panel according to claim 10, wherein the first hole transmission layer is arranged between the electron blocking layer and the anode, and an absolute value of a difference between a lowest unoccupied molecular orbital energy level of the first hole transmission layer LUMO.HTL and a lowest unoccupied molecular orbital energy level of the host material of the organic light-emitting layer LUMO.EML-host satisfies:

|LUMO.EML-host−LUMO.HTL|<1.2 eV.

14. The organic light-emitting display panel according to claim 1, wherein the organic functional layer further comprises a hole blocking layer arranged between the first electron transmission layer and the organic light-emitting layer, a highest occupied molecular orbital energy level of the hole blocking layer HOMO.HBL satisfies:

5.6 eV<|HOMO.HBL|<6.5 eV; and a lowest unoccupied molecular orbital energy level of the hole blocking layer LUMO.HBL satisfies:

2.1 eV<|LUMO.HBL|<3 eV.

15. The organic light-emitting display panel according to claim 14, wherein an absolute value of a difference between the lowest unoccupied molecular orbital energy level of the hole blocking layer LUMO.HBL and the lowest unoccupied molecular orbital energy level of the host material of the organic light-emitting layer LUMO.EML-host satisfies:

|LUMO.EML-host−LUMO.HBL|<1 eV.

16. The organic light-emitting display panel according to claim 14, wherein the hole blocking layer comprises an alkaline earth metal element or a rare earth metal element which belongs to a same type of the alkaline earth metal element or the rare earth metal element comprised in the first electron transmission layer.

17. The organic light-emitting display panel according to claim 16, wherein a triplet level T1.HTL of the first hole transmission layer and the triplet level T1.EBL of the electron blocking layer satisfy:

|T1.HTL−T1.EBL|<0.4 eV.

18. The organic light-emitting display panel according to claim 17, wherein the organic functional layer further comprises a hole injection layer arranged between the first hole transmission layer and the anode, a lowest unoccupied molecular orbital energy level of a P-type dopant comprised in the hole injection layer LUMO.P-HIL satisfies:

|LUMO.P-HIL|>4 eV.

19. The organic light-emitting display panel according to claim 18, wherein an absolute value of a difference between the lowest unoccupied molecular orbital energy level of the P-type dopant in the hole injection layer LUMO.P-HIL and the highest unoccupied molecular orbital energy level of the host material of the organic light-emitting layer HOMO.EML-host satisfies:

|LUMO.EML-host−HOMO.P-HIL|<1.2 eV.

20. An organic light-emitting display device comprising the organic light-emitting display panel according to claim 1.

* * * * *